United States Patent
Igarashi et al.

(10) Patent No.: US 11,030,028 B2
(45) Date of Patent: Jun. 8, 2021

(54) FAILURE DETECTION APPARATUS, FAILURE DETECTION METHOD, AND NON-TRANSITORY COMPUTER READABLE RECORDING MEDIUM

(71) Applicant: YOKOGAWA ELECTRIC CORPORATION, Musashino (JP)

(72) Inventors: Shouji Igarashi, Musashino (JP); Hidekazu Tanaka, Musashino (JP); Tomohiro Kajikawa, Musashino (JP)

(73) Assignee: YOKOGAWA ELECTRIC CORPORATION, Musashino (JP)

( * ) Notice: Subject to any disclaimer, the term of this patent is extended or adjusted under 35 U.S.C. 154(b) by 119 days.

(21) Appl. No.: 16/385,723

(22) Filed: Apr. 16, 2019

(65) Prior Publication Data

US 2019/0324835 A1    Oct. 24, 2019

(30) Foreign Application Priority Data

Apr. 20, 2018   (JP) .............................. JP2018-081750

(51) Int. Cl.
```
G06F 11/00      (2006.01)
G06F 11/07      (2006.01)
G06F 3/06       (2006.01)
G06F 11/30      (2006.01)
```
(52) U.S. Cl.
CPC ........ *G06F 11/0712* (2013.01); *G06F 3/0619* (2013.01); *G06F 3/0644* (2013.01); *G06F 3/0679* (2013.01); *G06F 11/301* (2013.01)

(58) Field of Classification Search
None
See application file for complete search history.

(56) References Cited

U.S. PATENT DOCUMENTS 7,246,269 B1     7/2007  Hamilton
8,862,952 B1 *  10/2014  Booth ................. G06F 11/1068
                                                714/718

FOREIGN PATENT DOCUMENTS

| EP | 0380918 A1 * | 8/1990 | ............. G01F 23/22 |
|---|---|---|---|
| EP | 2963716 A1 | 1/2016 | |
| JP | 2003323353 A | 11/2003 | |
| JP | 2006268266 A | 10/2006 | |
| JP | 2007155706 A | 6/2007 | |
| JP | 2013171348 A | 9/2013 | |
| JP | 2016170567 A | 9/2016 | |
| WO | 2015147829 A1 | 10/2015 | |
| WO | WO-2015147829 A1 * | 10/2015 | ............. G11C 29/52 |

* cited by examiner

*Primary Examiner* — Matthew M Kim
*Assistant Examiner* — Kyle Emanuele
(74) *Attorney, Agent, or Firm* — Kenja IP Law PC

(57) ABSTRACT

A failure detection apparatus (10) includes a RAM (125) and a controller (122) configured to execute processing related to detection of a physical quantity in a predetermined sampling period ($T_1$). The RAM (125) includes partitioned areas generated by partitioning the entire area of the RAM (125). The controller (122) is configured to execute sequential failure detection on a portion of the partitioned areas during a time when the controller (122) is not executing the processing in each of the sampling periods ($T_1$).

6 Claims, 7 Drawing Sheets

US 11,030,028 B2

FAILURE DETECTION APPARATUS, FAILURE DETECTION METHOD, AND NON-TRANSITORY COMPUTER READABLE RECORDING MEDIUM

CROSS-REFERENCE TO RELATED APPLICATION

The present application claims priority to and the benefit of Japanese Patent Application No. 2018-081750 filed Apr. 20, 2018, the entire contents of which are incorporated herein by reference.

TECHNICAL FIELD

The present disclosure relates to a failure detection apparatus, a failure detection method, and a non-transitory computer readable recording medium.

BACKGROUND

Apparatuses for performing diagnostics on memory are known. For example, patent literature (PTL) 1 discloses an apparatus for performing diagnostics on a safety mechanism (SM) random access memory (RAM) area of RAM.

CITATION LIST

Patent Literature

PTL 1: JP2016170567A

SUMMARY

A failure detection apparatus according to an embodiment includes a RAM and a controller configured to execute processing related to detection of a physical quantity in a predetermined sampling period. The RAM includes a plurality of partitioned areas generated by partitioning the entire area of the RAM. The controller is configured to execute sequential failure detection on a portion of the plurality of partitioned areas during a time when the controller is not executing the processing in each of a plurality of the sampling periods.

A failure detection method according to an embodiment is a failure detection method to be executed by a failure detection apparatus including a RAM. The RAM includes a plurality of partitioned areas generated by partitioning the entire area of the RAM. The failure detection method includes executing processing related to detection of a physical quantity in a predetermined sampling period and executing sequential failure detection on a portion of the plurality of partitioned areas during a time when the processing is not being executed in each of a plurality of the sampling periods.

A non-transitory computer readable recording medium according to an embodiment is a non-transitory computer readable recording medium having stored thereon instructions to be executed on a failure detection apparatus, which includes a RAM that includes a plurality of partitioned areas generated by partitioning the entire area of the RAM. The instructions causes the failure detection apparatus to execute the steps of executing processing related to detection of a physical quantity in a predetermined sampling period and executing sequential failure detection on a portion of the plurality of partitioned areas during a time when the processing is not being executed in each of a plurality of the sampling periods.

DETAILED DESCRIPTION

Figure 1:
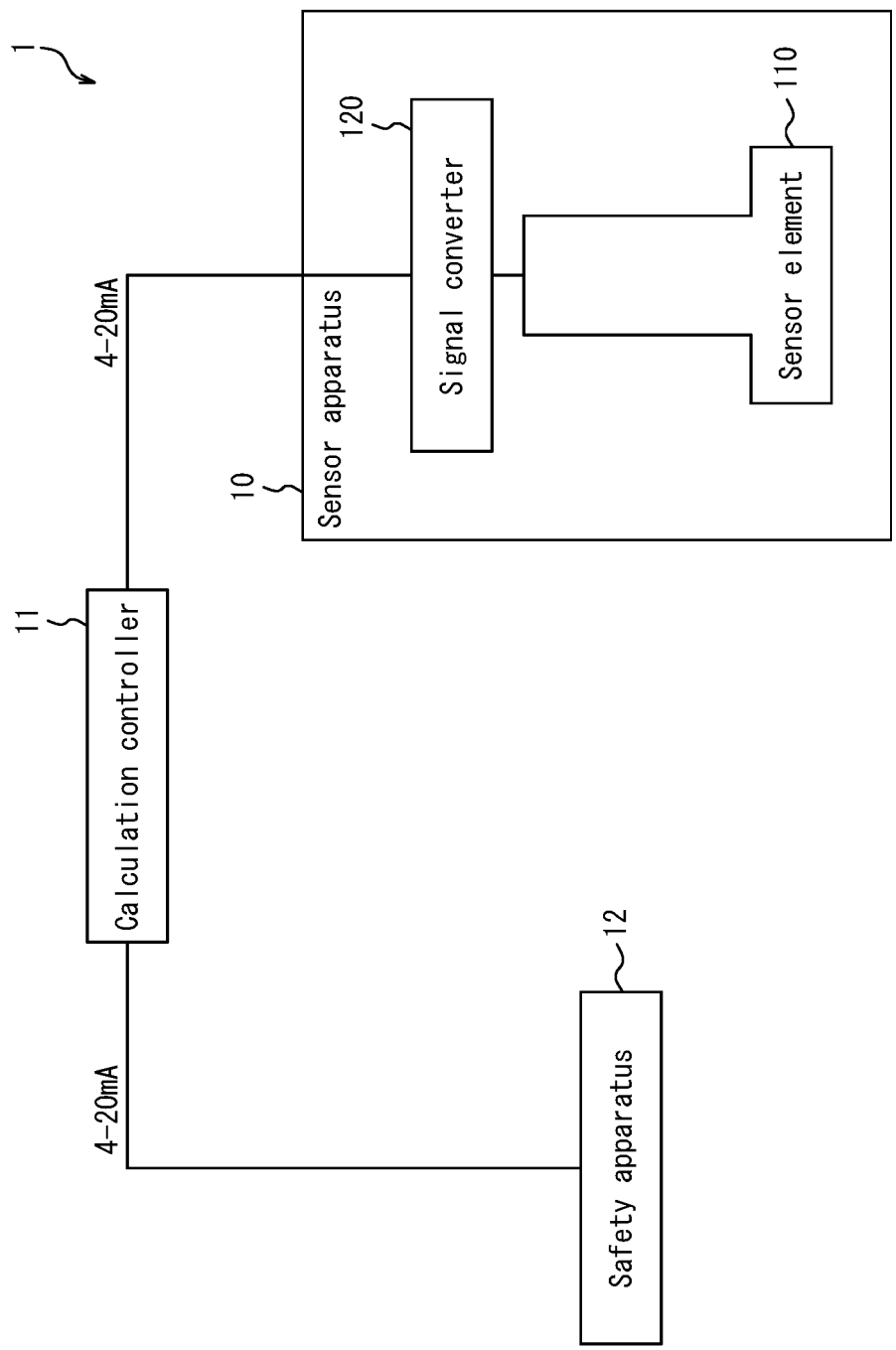
FIG. 1 is a functional block diagram illustrating an example schematic configuration of a safety instrumented system according to an embodiment.

The apparatus disclosed in PTL 1, however, merely performs diagnostics on the SMRAM area, which is a portion of the RAM. The apparatus disclosed in PTL 1 therefore cannot detect failure occurring in an undiagnosed area.

It is an objective of the present disclosure to provide a failure detection apparatus, a failure detection method, and a non-transitory computer readable recording medium.

A failure detection apparatus according to an embodiment includes a RAM and a controller configured to execute processing related to detection of a physical quantity in a predetermined sampling period. The RAM includes a plurality of partitioned areas generated by partitioning the entire area of the RAM. The controller is configured to execute sequential failure detection on a portion of the plurality of partitioned areas during a time when the controller is not executing the processing in each of a plurality of the sampling periods. This configuration allows execution of failure processing on the entire area of the RAM, including the areas that affect operation of a sensor apparatus.

In a failure detection apparatus according to an embodiment, the controller may be configured to execute failure detection on a priority basis on a specific partitioned area among the plurality of partitioned areas. This configuration facilitates earlier detection of failure in the specific partitioned area.

In a failure detection apparatus according to an embodiment, the specific partitioned area may belong to a calculation result storage area configured to store a result of calculation processing executed by the controller. This configuration can achieve earlier detection of failure occurring in the calculation result storage area.

In a failure detection apparatus according to an embodiment, the controller may be configured to execute processing related to detection of a property of a liquid. This configuration can detect properties of liquids.

A failure detection method according to an embodiment is a failure detection method to be executed by a failure detection apparatus including a RAM. The RAM includes a plurality of partitioned areas generated by partitioning the entire area of the RAM. The failure detection method includes executing processing related to detection of a physical quantity in a predetermined sampling period and executing sequential failure detection on a portion of the plurality of partitioned areas during a time when the processing is not being executed in each of a plurality of the sampling periods. This configuration allows execution of failure processing on all of the areas of the RAM, including the areas that affect operation of a sensor apparatus.

A non-transitory computer readable recording medium having stored thereon instructions to be executed on a failure detection apparatus, which includes a RAM that includes a plurality of partitioned areas generated by partitioning the entire area of the RAM. The instructions causes the failure detection apparatus to execute the steps of executing processing related to detection of a physical quantity in a predetermined sampling period and executing sequential failure detection on a portion of the plurality of partitioned areas during a time when the processing is not being executed in each of a plurality of the sampling periods. This configuration allows execution of failure processing on the entire area of the RAM, including the areas that affect operation of a sensor apparatus.

Embodiments of the present disclosure are now described with reference to the drawings.

FIG. 1 is a functional block diagram illustrating an example schematic configuration of a safety instrumented system 1 according to an embodiment. The safety instrumented system 1 is, for example, provided on an operation line in a plant. The safety instrumented system 1 is a system provided to suspend the plant in a safe state during an emergency, such as when an abnormality occurs in a device on the operation line. Having the safety instrumented system 1 stop operation of the plant during an emergency can prevent disasters such as explosions or fatal accidents, environmental pollution, and the like and can protect equipment. Examples of the plant include an industrial plant such as a chemical plant; a plant for managing a well site, such as a gas field or oil field, and the surrounding area; a plant for managing power generation such as hydroelectric power, thermal power, nuclear power, or the like; a plant for managing environmental power generation such as solar power, wind power, or the like; and a plant for managing water and sewage, a dam, or the like. The plant is not, however, limited to these examples.

The example safety instrumented system 1 illustrated in FIG. 1 includes a sensor apparatus 10, a calculation controller 11, and a safety apparatus 12. In the safety instrumented system 1, the sensor apparatus 10 functions as a failure detection apparatus that performs failure detection on internal RAM.

The sensor apparatus 10 is an apparatus for executing processing related to detection of a predetermined physical quantity on the operation line. The processing related to detection of a predetermined physical quantity includes detection of the predetermined physical quantity and output of a signal corresponding to the detected physical quantity. The predetermined physical quantity may be determined appropriately in accordance with properties of the devices, substances, and the like used on the operation line. The sensor apparatus 10 transmits a signal corresponding to the detected physical quantity to the calculation controller 11. In the example in FIG. 1, the sensor apparatus 10 transmits a signal corresponding to the detected physical quantity to the calculation controller 11 using a 4 mA to 20 mA current. In other words, the sensor apparatus 10 transmits a current in a range of 4 mA to 20 mA to the calculation controller 11 in accordance with the value of the detected physical quantity. In the present disclosure, the predetermined physical quantity that the sensor apparatus 10 detects is described as being the hydrogen ion exponent (pH) of a fluid used in the operation line. The predetermined physical quantity is not, however, limited to pH. In the present disclosure, the processing executed by the sensor apparatus 10 is also referred to as "sensor processing". The sensor processing includes processing related to detection of a physical quantity.

Figure 2:
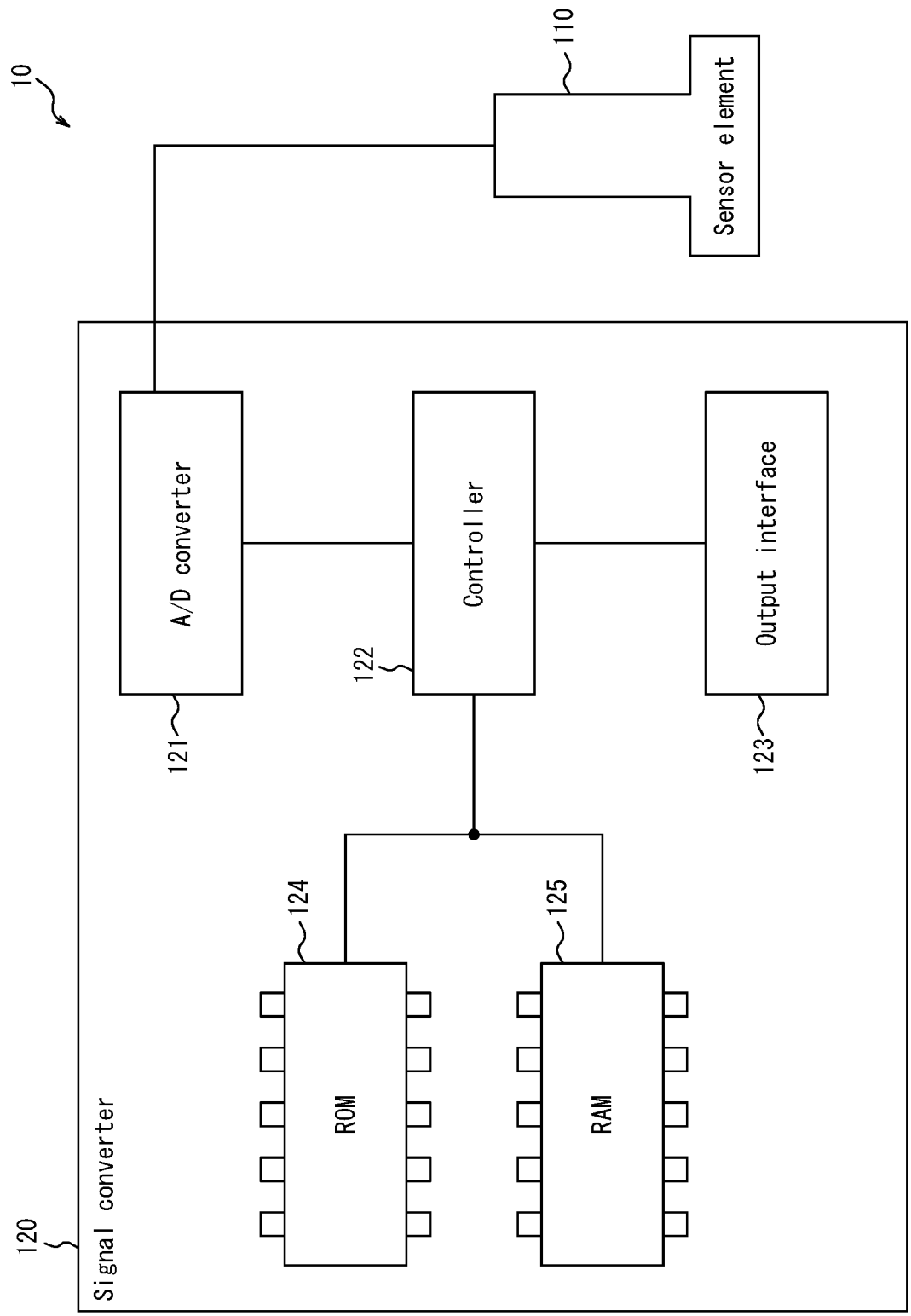
FIG. 2 is a functional block diagram illustrating an example schematic configuration of the sensor apparatus illustrated in FIG. 1.

As illustrated in FIG. 1, the sensor apparatus 10 includes a sensor element 110 and a signal converter 120. FIG. 2 is a functional block diagram illustrating an example schematic configuration of the sensor apparatus 10.

The sensor element 110 is an element for detecting the above-described predetermined physical quantity. Here, the sensor element 110 is a sensor element capable of detecting the pH of a fluid.

The signal converter 120 receives an electric signal outputted by the sensor element 110 on the basis of the detection result, performs digital signal processing on the electric signal, and outputs a current of 4 mA to 20 mA to the calculation controller 11 on the basis of the result of the digital signal processing.

In the example in FIG. 2, the signal converter 120 includes an analog-to-digital (A/D) converter 121, a controller 122, an output interface 123, read only memory (ROM) 124, and RAM 125.

The A/D converter 121 converts an analog electric signal, outputted by the sensor element 110 on the basis of the detection result, to a digital signal.

The controller 122 controls and manages the signal converter 120 overall, starting with the functional blocks of the signal converter 120. The controller 122 may be configured as software executed by a suitable processor, such as a central processing unit (CPU), or configured as a dedicated processor specialized for each process.

In accordance with a program stored in the ROM 124, for example, the controller 122 performs predetermined calculation processing on the digital signal converted by the A/D converter 121. The controller 122 stores the result of the calculation processing (calculation result) in the RAM 125, for example. The controller 122 also converts the calculation result stored in the RAM 125 to a 4 mA to 20 mA current and outputs the current periodically, for example, to the calculation controller 11.

The output interface 123 is an interface for outputting signals to the calculation controller 11 on the basis of control by the controller 122. Here, the output interface 123 outputs 4 mA to 20 mA current signals to the calculation controller 11 on the basis of control by the controller 122.

The ROM 124 functions as a memory of the signal converter 120. The ROM 124 stores programs executed by the controller 122, for example.

The RAM 125 functions as a memory of the signal converter 120. The RAM 125 stores the calculation result from the controller 122, for example.

Figure 3:
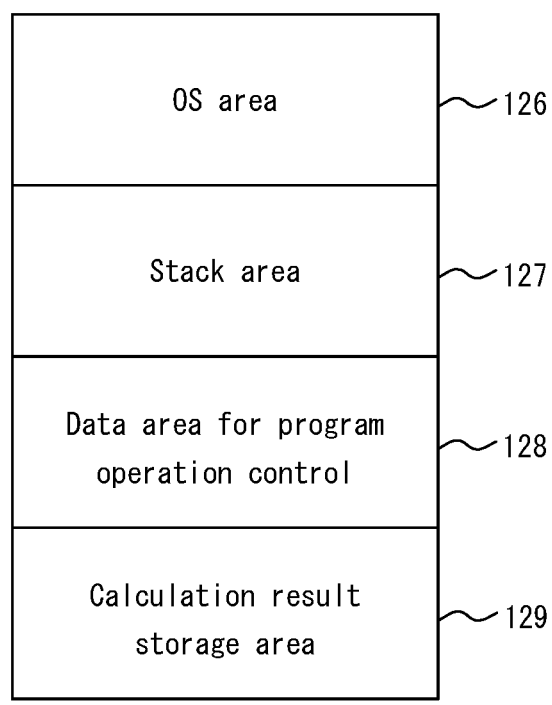
FIG. 3 schematically illustrates an example of data areas in the RAM of FIG. 2.

FIG. 3 schematically illustrates an example of data areas in the RAM 125. As illustrated in FIG. 3, the RAM 125 includes an operating system (OS) area 126, a stack area 127, a data area for program operation control 128, and a calculation result storage area 129 as data areas. The OS area 126 is an area storing software for the controller 122 to operate. The stack area 127 is an area for temporarily storing data during execution of processing by the controller 122. The data area for program operation control 128 is an area for storing data used when running programs. Data such as the number of measurements for calculating an average is stored here. The calculation result storage area 129 is an area for storing the result of calculation processing that the controller 122 executes on the digital signal converted by the A/D converter 121, as described above.

Referring again to FIG. 1, the calculation controller 11 receives a current signal from the sensor apparatus 10. The calculation controller 11 executes safety control logic for implementing safety control. When judging, for example on the basis of the received current signal, that an abnormality has occurred, the calculation controller 11 transmits a control signal to the safety apparatus 12 to cause the safety apparatus 12 to execute predetermined control. The calculation controller 11 may be constituted by a mechanism known as a logic solver.

The safety apparatus 12 executes predetermined control on the basis of the control signal received from the calculation controller 11. For example, on the basis of the control signal received from the calculation controller 11, the safety apparatus 12 executes control to stop the operation line.

The safety apparatus 12 may, for example, be formed by a valve positioner, an electromagnetic valve, or the like. When judging, on the basis of the received current signal, that an abnormality has occurred, the calculation controller 11 transmits a control signal to the safety apparatus 12 to close the valve. The safety apparatus 12 configured as a valve positioner or an electromagnetic valve can, for example, stop the supply of a fluid to the line by closing the valve in response to the control signal received from the calculation controller 11.

In the safety instrumented system 1 illustrated as an example in FIG. 1, a safety integrity level (SIL) is known as an index related to the likelihood of fulfilling a safety function. The safety integrity level is classified into four stages from SIL1 to SIL4, where SIL1 indicates the lowest level of safety, and SIL4 indicates the highest level of safety. The SIL may, for example, be determined in accordance with the functional safety standard IEC 61508.

The SIL of the safety instrumented system 1 is, for example, determined by the product of the probability of failure on demand (PFD) of each constituent element of the safety instrumented system 1. In other words, in the example safety instrumented system 1 illustrated in FIG. 1, the SIL is determined by the product of the PFDs of the sensor apparatus 10, the calculation controller 11, and the safety apparatus 12. As the product of the PFDs of the constituent elements is lower, the index indicated by the SIL classification increases. In other words, as the product of the PFDs of the constituent elements is lower, safety is higher.

The sensor apparatus 10 of the safety instrumented system 1 includes the RAM 125, as described with reference to FIG. 2. Failure more easily occurs in the RAM 125, however, than in the other functional units. In other words, the PFD of the RAM 125 tends to increase. The PFD of the RAM 125 therefore tends to have a large effect on the SIL of the safety instrumented system 1. Hence, the SIL of the safety instrumented system 1 overall can easily be increased by improving the PFD of the RAM 125.

In a known technique, failure detection is executed on the entire RAM 125 upon startup of the safety instrumented system 1, for example, whereas during operation of the RAM 125, failure detection is executed on the calculation result storage area 129 among the areas of the RAM 125. Failure detection is only executed on the calculation result storage area 129 during operation of the RAM 125, however, and failure detection is not executed on other areas that affect operation of the safety instrumented system 1. In the example in FIG. 3, the other areas that affect operation of the safety instrumented system 1 are the OS area 126, the stack area 127, and the data area for program operation control 128. Furthermore, operation of the RAM 125 needs to stop if failure detection is to be executed on areas other than the calculation result storage area 129, such as the OS area 126, during operation of the RAM 125. Stopping operation of the RAM 125 and executing failure detection, however, hinders operation of the safety instrumented system 1. Stopping operation of the RAM 125 to execute failure detection is therefore not realistic.

On the other hand, if the RAM 125 included an error check and correct (ECC) function, the RAM 125 could execute failure detection on the entire RAM 125 by executing ECC-based failure detection, even during operation of the RAM 125. The ECC function is capable of detecting that an error has occurred in data stored in the RAM 125 and of correcting the erroneous data. However, RAM 125 with an ECC function is more expensive than RAM 125 without an ECC function. Hence, the cost of the safety instrumented system 1 increases upon using RAM 125 with an ECC function.

The present disclosure therefore provides a failure detection apparatus, a failure detection method, and a non-transitory computer readable recording medium capable of using a less expensive RAM 125, without an ECC function, to execute failure detection during operation of the RAM 125.

Here, a concrete method of failure detection executed by the sensor apparatus 10 according to the present embodiment is described. Suppose that failure detection executed on the entire area of the RAM 125 requires approximately several hundred milliseconds to several seconds, for example. It is unrealistic, however, to stop the RAM 125 for several hundred milliseconds to several seconds while the RAM 125 is operating, as described above.

To address this issue, the sensor apparatus 10 according to the present embodiment executes sequential failure detection on a plurality of elements yielded by partitioning the entire area of the RAM 125 and thus divides up the entire area of the RAM 125 to perform failure detection.

Figure 4:
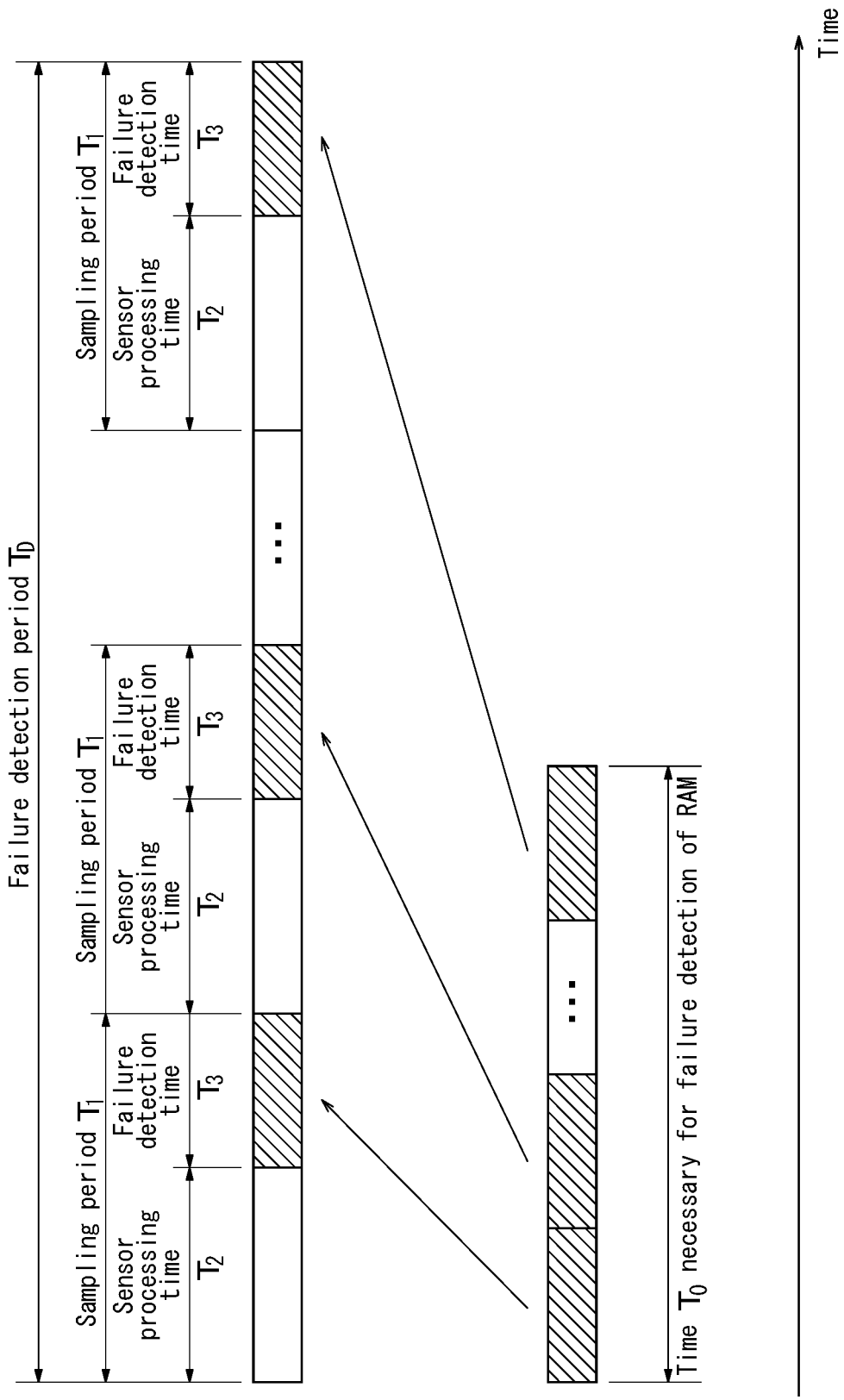
FIG. 4 illustrates a method of failure detection executed by the sensor apparatus of FIG. 1.

FIG. 4 illustrates a method of failure detection executed by the sensor apparatus 10 according to the present embodiment. The upper and lower tiers of FIG. 4 are time charts illustrating processing executed by the sensor apparatus 10. The horizontal axis in FIG. 4 represents time.

The time chart in the lower tier of FIG. 4 indicates processing when the sensor apparatus 10 executes failure detection at once on the entire area of the RAM 125. When failure detection is executed at once on the entire area of the RAM 125, a predetermined time $T_0$ is required for failure detection of the entire area of the RAM 125. As described above, the predetermined time $T_0$ is several hundred milliseconds to several seconds, for example. When failure detection is thus executed at once on the entire area of the RAM 125, operation of the RAM 125 needs to be stopped for the predetermined time $T_0$.

The time chart in the upper tier of FIG. 4 illustrates failure detection processing executed by the sensor apparatus 10 according to the present embodiment. During failure detection, the sensor apparatus 10 according to the present embodiment uses a plurality of elements generated by partitioning the entire area of the RAM 125. The partitioned elements generated by partitioning the entire area of the RAM 125 are also referred to as "partitioned areas" in the present disclosure. The time chart in the lower tier of FIG. 4 illustrates an example of partitioned areas yielded by partitioning the entire area of the RAM 125. In the present embodiment, the partitioned areas of the RAM 125 may be determined in advance and set in the sensor apparatus 10.

The partitioned areas may be partitioned by a different classification than the example data areas of the RAM 125 illustrated in FIG. 3. In other words, the partitioned areas need not be the four areas consisting of the OS area 126, the stack area 127, the data area for program operation control 128, and the calculation result storage area 129. For example, the OS area 126, the stack area 127, the data area for program operation control 128, and the calculation result storage area 129 may each be further partitioned to form the partitioned areas. In this case, each partitioned area belongs to one of the OS area 126, the stack area 127, the data area for program operation control 128, and the calculation result storage area 129.

As illustrated in the time chart in the upper tier in FIG. 4, the sensor apparatus 10 according to the present embodiment executes the sensor processing over a certain sampling period $T_1$, for example. The sampling period $T_1$ may be set appropriately in accordance with the physical quantity to be detected, the specifications of the sensor element 110, and the like, for example.

During each the sampling period $T_1$, the sensor apparatus 10 executes sensor processing. For example, the sensor apparatus 10 executes processing to detect a physical quantity during each sampling period $T_1$. The sensor processing that the sensor apparatus 10 executes can be completed without taking up the entire sampling period $T_1$. For example, in each sampling period $T_1$, the sensor apparatus 10 can complete the sensor processing to be executed during the sampling period $T_1$ within a predetermined time $T_2$ after the start of sampling (where $T_1 > T_2$). In other words, the sensor apparatus 10 does not execute sensor processing in each sampling period $T_1$ during a time $T_3$ yielded by subtracting the predetermined time $T_2$ from the sampling period $T_1$ (where $T_1 = T_2 + T_3$). The predetermined time $T_2$ is also referred to below as the sensor processing time $T_2$.

The sensor apparatus 10 according to the present embodiment executes failure detection during the time $T_3$, within each sampling period $T_1$, when sensor processing is not being executed. At this time, the sensor apparatus 10 executes failure detection on one partitioned area of the RAM 125. The time $T_3$ is also referred to below as the failure detection time $T_3$.

The sensor apparatus 10 repeatedly alternates between sensor processing during the sensor processing time $T_2$ and failure detection during the failure detection time $T_3$ in the sampling periods $T_1$. During the failure detection times $T_3$ of the sampling periods $T_1$, the sensor apparatus 10 executes sequential failure detection on all of the partitioned areas. The sensor apparatus 10 thus sequentially executes failure detection on the partitioned areas in the sampling periods $T_1$. The sensor apparatus 10 can execute failure detection on the entire area of the RAM 125 by cycling through the same number of sampling periods $T_1$ as the number of partitioned areas. The time required for the sensor apparatus 10 according to the present embodiment to complete failure detection once on the entire area of the RAM 125 is also referred to below as the failure detection period $T_D$.

The failure detection period $T_D$ includes the same number of sampling periods $T_1$ as the number of partitioned areas of the RAM 125. The sensor apparatus 10 according to the present embodiment executes sequential failure detection on the partitioned areas of the RAM 125 in this way during the failure detection time $T_3$, which is a portion of each sampling period $T_1$. The sensor apparatus 10 can thereby execute failure detection on the entire area of the RAM 125 within the failure detection period $T_D$.

Figure 5:
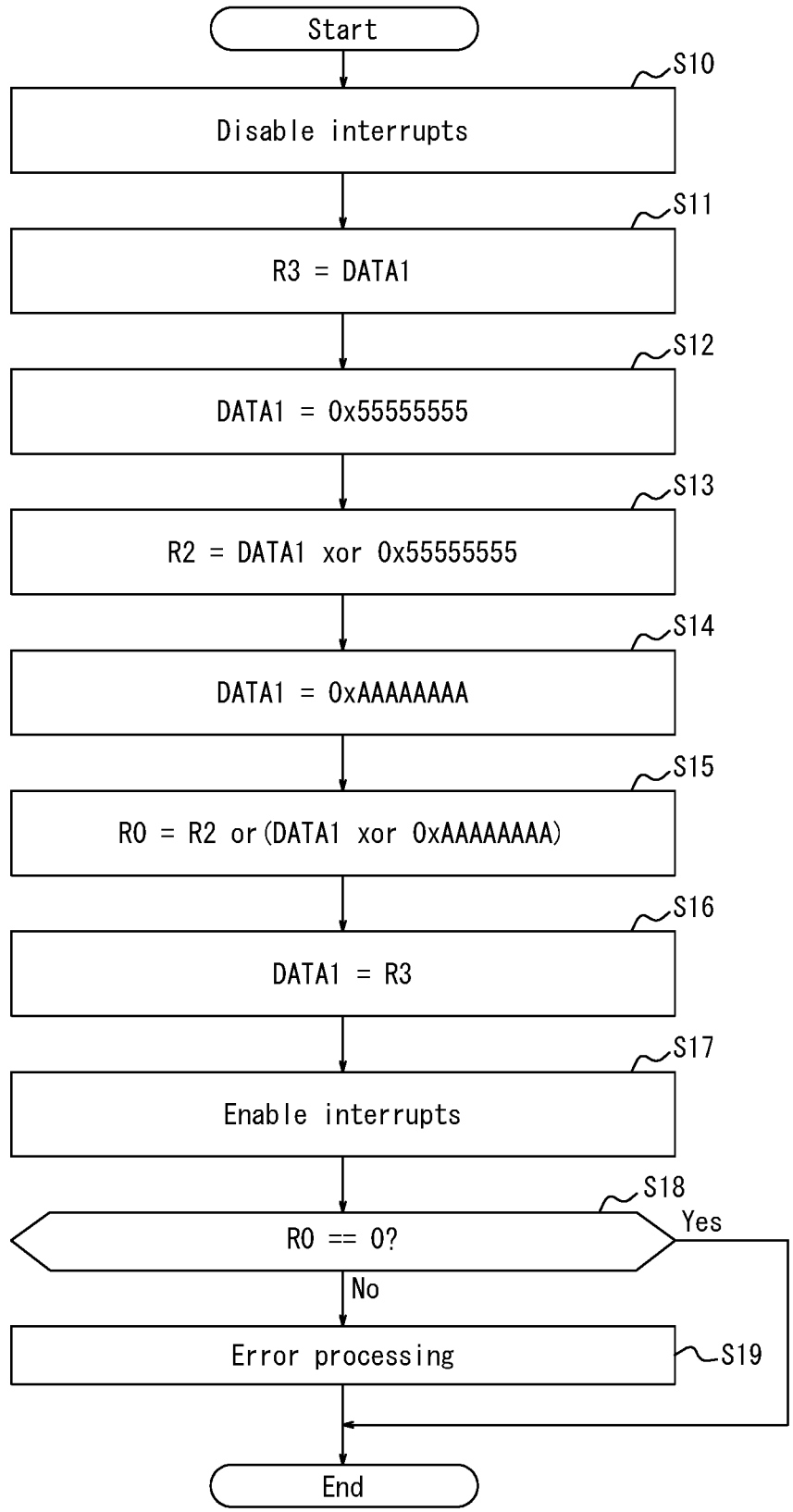
FIG. 5 is a flowchart illustrating an example of processing executed by the sensor apparatus of FIG. 1 during time $T_3$.

FIG. 5 is a flowchart illustrating an example of processing executed by the sensor apparatus 10 during the failure detection time $T_3$. The sensor apparatus 10 executes failure detection on one partitioned area by executing the processing illustrated as an example in FIG. 5 during the failure detection time $T_3$.

Figure 6:
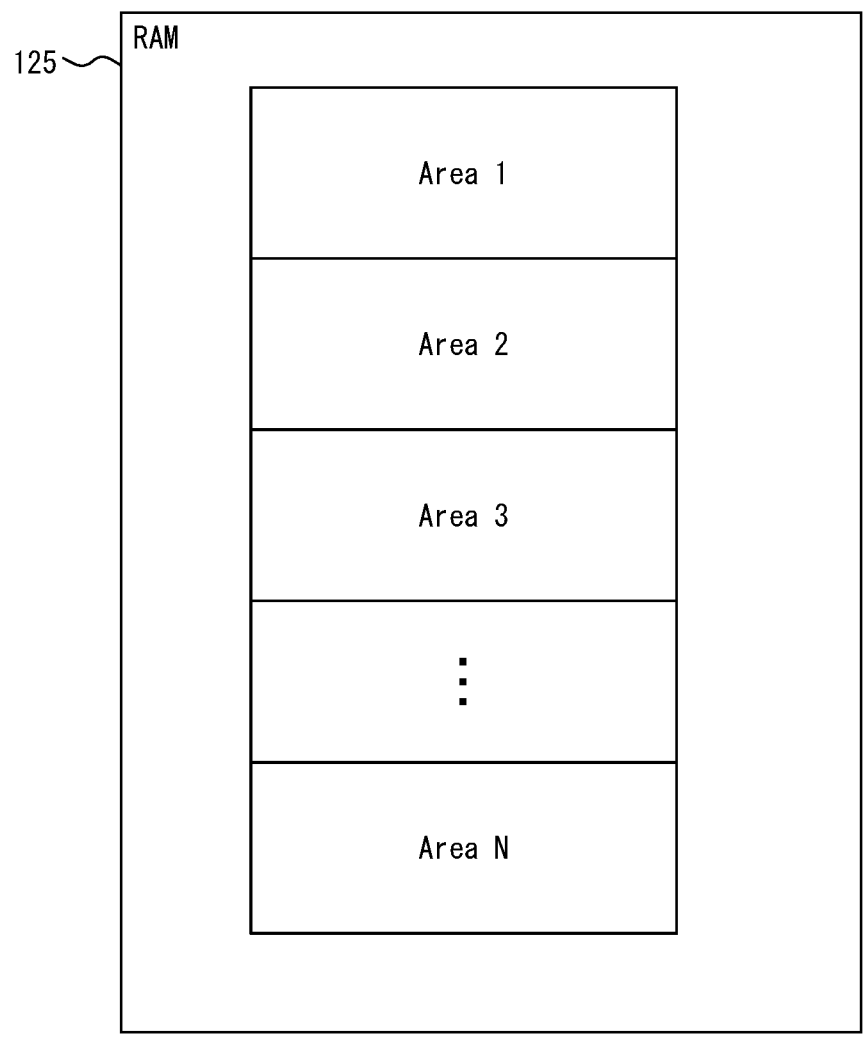
FIG. 6 illustrates partitioned areas generated by partitioning the entire area of RAM.

FIG. 6 illustrates partitioned areas generated by partitioning the entire area of the RAM 125. As illustrated in FIG. 6, the RAM 125 has N partitioned areas (N>1), from area 1 to area N, as the partitioned areas for executing failure detection. Data, for example, is stored in each partitioned area. The sensor apparatus 10 executes failure detection sequentially on the N partitioned areas from area 1 to area N during the failure detection time $T_3$ of each sampling period $T_1$. The procedures in FIG. 5 illustrate an example of failure detection processing on area 1 among the partitioned areas.

Figure 7:
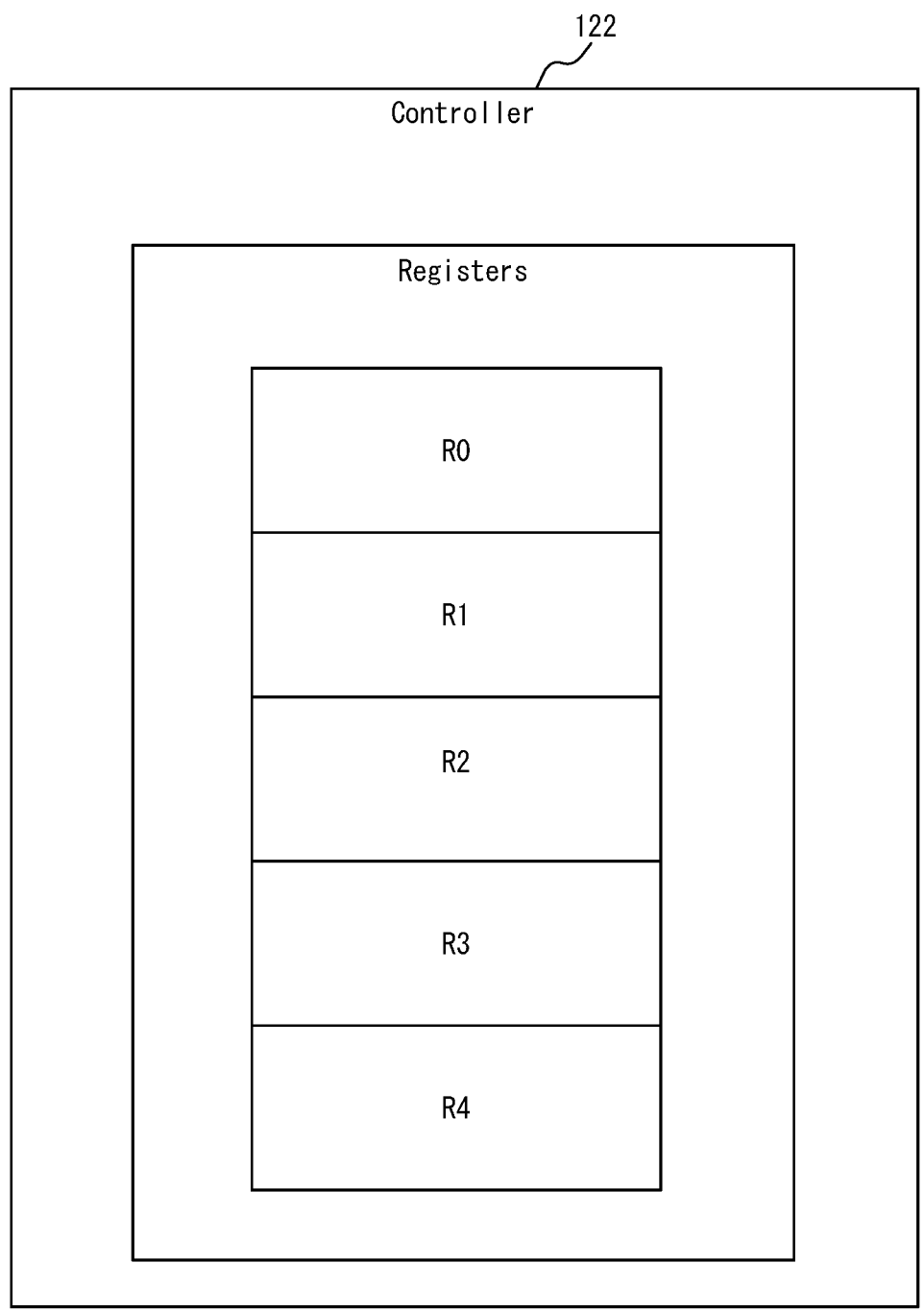
FIG. 7 schematically illustrates an example of registers included in a controller of the signal converter in FIG. 2.

FIG. 7 schematically illustrates example registers included in the controller 122 of the signal converter 120. In the present embodiment, the procedures in FIG. 5 are executed by the controller 122, which includes at least five registers from R0 to R4, as in the example in FIG. 7.

As illustrated in FIG. 5, the controller 122 executes processing to disable interrupts at the start of the failure detection time $T_3$ (step S10). Consequently, processing other than failure detection does not interrupt. In other words, processing other than the processing illustrated in the procedures of FIG. 5 will not be executed.

Next, the controller 122 transfers the data (DATA 1) stored in area 1 of the RAM 125 to register R3 of the controller 122 to store the DATA 1 in register R3 (step S11). The controller 122 thus temporarily saves the DATA 1 that was stored in area 1 in register R3.

The controller 122 then writes the value "0x55555555" as the DATA 1 of area 1 (step S12). "0x55555555" is a value represented as "01010101 . . . " in a 32-bit pattern.

The controller 122 calculates the exclusive OR of the DATA 1 and "0x55555555" and saves the calculation result in register R2 (step S13). Here, since "0x55555555" was written in the DATA 1 in step S12, the calculation result saved in register R2 is 0 if area 1 is normal.

The controller 122 then writes the value "0xAAAAAAAA" as the DATA 1 of area 1 (step S14). "0xAAAAAAAA" is a value represented as "10101010 . . . " in a 32-bit pattern.

The controller 122 calculates the OR of i) the exclusive OR of the DATA 1 and "0xAAAAAAAA" and ii) the calculation result saved in register R2 in step S13. The controller 122 saves the calculation result in register R0 (step S15). Here, since "0xAAAAAAAA" was written in the DATA 1 in step S14, the exclusive OR of the DATA 1 and "0xAAAAAAAA" is 0 if area 1 is normal. Accordingly, the calculation result saved in register R0 is 0 if area 1 is normal. Conversely, the calculation result saved in register R0 is a value other than 0 if an abnormality is present in area 1.

Next, the controller 122 stores the original data that was saved in register R3 in area 1 (step S16). In this way, the controller 122 restores the original data that was stored in area 1.

The controller 122 executes processing enabling interrupts (step S17). Consequently, processing other than failure detection can interrupt and be executed.

The controller 122 judges whether the calculation result saved in register R0 is 0 (step S18).

When judging that the calculation result saved in register R0 is 0 (step S18: Yes), the controller 122 judges that area 1 is normal and terminates the procedures.

Conversely, when judging that the calculation result saved in register R0 is not 0 (step S18: No), the controller 122 judges that an abnormality exists in area 1 and executes error processing (step S19). As the error processing, the controller 122 provides notification of the occurrence of an error, for example. The controller 122 then terminates the procedures.

Each time the failure detection time $T_3$ starts, the controller 122 executes the procedures in FIG. 5 to execute sequential failure detection on the partitioned areas from area 1 to area N. The controller 122 can thus execute failure detection on the entire area of the RAM 125 within the failure detection period $T_D$.

In this way, the sensor apparatus 10 according to the present embodiment executes failure detection during the failure detection time $T_3$, in which sensor processing is not being executed, within each sampling period $T_1$ on the partitioned areas yielded by partitioning the RAM 125. The sensor apparatus 10 can therefore execute failure processing on all of the areas of the RAM 125, including the areas that affect operation of the sensor apparatus 10, i.e. the OS area 126, the stack area 127, and the data area for program operation control 128. Furthermore, by executing failure detection during the failure detection time $T_3$ in which sensor processing is not being executed, the sensor apparatus 10 can execute failure detection without affecting the sensor processing executed by the sensor apparatus 10. In other words, the sensor apparatus 10 can execute failure detection without impairing the functions in the safety instrumented system 1.

Since the sensor apparatus 10 according to the present embodiment executes failure detection on the entire area of the RAM 125, the probability of overlooking failure of the RAM 125 is lower than when failure detection is only executed on a portion of the area of the RAM 125. The PFD of the sensor apparatus 10 thus decreases. Consequently, the PFD of the safety instrumented system 1 overall can be reduced, improving the SIL.

The SIL of the safety instrumented system 1 has been described in the above embodiment as being determined by the product of the PFDs of the constituent elements of the safety instrumented system 1. The SIL of the safety instrumented system 1 may, however, be determined on the basis of the safe failure fraction (SFF) and the fault tolerance (FT). For example, the SIL may be determined so that the index indicated by the SIL classification increases as the SFF is higher or as the FT is higher.

In the above embodiment, the sensor apparatus 10 has been described as executing failure detection on one partitioned area of the RAM 125 during the failure detection time $T_3$ of each sampling period $T_1$. However, the target of failure detection that the sensor apparatus 10 executes during the failure detection time $T_3$ of each sampling period $T_1$ is not limited to being one partitioned area. The sensor apparatus 10 may execute failure detection on two or more partitioned areas of the RAM 125 during the failure detection time $T_3$ of each sampling period $T_1$. This approach may, for example, be taken only when failure detection can be executed on two or more partitioned areas during the failure detection time $T_3$. In this way, the sensor apparatus 10 may execute failure detection on a portion of the plurality of partitioned areas of the RAM 125 during the failure detection time $T_3$ of each sampling period $T_1$. When the sensor apparatus 10 executes failure detection on two or more partitioned areas during the failure detection time $T_3$ of each sampling period $T_1$, the sensor apparatus 10 can execute failure detection processing on the entire RAM 125 earlier than when executing failure detection on one partitioned area. In other words, the failure detection period $T_D$ can be shortened.

In the above embodiment, the sensor apparatus 10 may execute failure detection on a priority basis on a specific partitioned area that is a portion of the plurality of partitioned areas. Here, executing failure detection on a priority basis refers to executing failure detection on the specific partitioned area before the other partitioned areas, i.e. at an earlier stage in the failure detection period $T_D$. The specific partitioned area on which failure detection is executed on a priority basis may, for example, be determined in advance and set in the sensor apparatus 10. Specific partitioned areas may, for example, be areas that could affect the SIL classification among the plurality of partitioned areas. Executing failure detection on a priority basis on specific partitioned areas facilitates earlier detection of failure in the specific partitioned areas.

For example, the specific partitioned areas may be the partitioned areas belonging to the calculation result storage area 129. The sensor apparatus 10 may in this case execute failure detection on a priority basis on the partitioned areas belonging to the calculation result storage area 129 as the specific partitioned area. When failure occurs outside of the calculation result storage area 129, for example in the OS area 126, the sensor apparatus 10 operates abnormally, and failure of the sensor apparatus 10 can be discovered. On the other hand, when failure occurs in the calculation result storage area 129, it is difficult to judge whether the calculation result is normal or abnormal, making it difficult to discover failure of the sensor apparatus 10. The occurrence of failure in the calculation result storage area 129, however, may result in a normal calculation result not being output, and the safety instrumented system 1 may stop operating normally. In this way, the probability of overlooking failure is high when failure occurs in the calculation result storage area 129. This issue can be addressed by executing failure detection on a priority basis on partitioned areas belonging to the calculation result storage area 129, as a specific partitioned area, to allow failure in the calculation result storage area 129 to be detected earlier.

The sensor apparatus 10 according to the above embodiment has been described as an apparatus for detecting a predetermined physical quantity on an operation line. Here, in particular when the sensor processing is executed, a longer sampling period $T_1$ is suitable for the failure detection method described in the above embodiment. The reason is that a longer failure detection time $T_3$ can more easily be set aside as the sampling period $T_1$ is longer, allowing more time to be used for failure detection in each sampling period $T_1$.

In the case of a fluid being supplied to the operation line, for example, the properties of liquids generally tend to change more gradually than the properties of gases. Hence, if the sampling period $T_1$ is longer, a sensor apparatus 10 that detects properties of liquids can detect the properties more easily than can a sensor apparatus 10 that detects the properties of gases. The sensor apparatus 10 may therefore be an apparatus that detects the properties of a liquid or the change in the properties of the liquid as the predetermined physical quantity in the operation line. This is not, however, meant to exclude the sensor apparatus 10 from being an apparatus that detects the properties of a gas or the change in the properties of the gas.

Embodiments of the present disclosure have been described with reference to the drawings, but the present disclosure is not limited to these embodiments, and a variety of modifications may be made without departing from the spirit and scope thereof.

The invention claimed is:

1. A failure detection apparatus comprising:
a RAM; and
a controller configured to execute processing related to detection of a physical quantity in a predetermined sampling period;
wherein the RAM comprises a plurality of partitioned areas generated by partitioning an entire area of the RAM; and
wherein the controller is configured to execute, during each sampling period in a sequence of sampling periods, sequential failure detection on a portion of the plurality of partitioned areas during a remaining time of each sampling period, when the controller is not executing the processing in each of the sampling periods, the controller thereby executing in alternating sequence the processing related to the detection of the physical quantity and the sequential failure detection, and wherein
the sampling periods are set depending on the detected physical quantity.

2. The failure detection apparatus of claim 1, wherein the controller is configured to execute failure detection on a priority basis on a specific partitioned area among the plurality of partitioned areas.

3. The failure detection apparatus of claim 2, wherein the specific partitioned area belongs to a calculation result storage area configured to store a result of calculation processing executed by the controller.

4. The failure detection apparatus of claim 1, wherein the controller is configured to execute processing related to detection of a property of a liquid.

5. A failure detection method to be executed by a failure detection apparatus comprising a RAM,
wherein the RAM comprises a plurality of partitioned areas generated by partitioning an entire area of the RAM;
wherein the failure detection method comprises:
executing processing related to detection of a physical quantity in a predetermined sampling period; and
during each sampling period in a sequence of sampling periods, executing sequential failure detection on a portion of the plurality of partitioned areas during a remaining time of each sampling period, when the processing is not being executed in each of the sampling periods, executing in alternating sequence the processing related to the detection of the physical quantity and the sequential failure detection, and wherein
the sampling periods are set depending on the detected physical quantity.

6. A non-transitory computer readable recording medium having stored thereon instructions to be executed on a failure detection apparatus comprising a RAM that includes a plurality of partitioned areas generated by partitioning an entire area of the RAM, the instructions causing the failure detection apparatus to execute the steps of:
executing processing related to detection of a physical quantity in a predetermined sampling period; and
during each sampling period in a sequence of sampling periods, executing sequential failure detection on a portion of the plurality of partitioned areas during a remaining time of each sampling period, when the processing is not being executed in each of the sampling periods, executing in alternating sequence the processing related to the detection of the physical quantity and the sequential failure detection, and wherein
the sampling periods are set depending on the detected physical quantity.

* * * * *